United States Patent
Koveshnikov et al.

(10) Patent No.: US 6,423,556 B1
(45) Date of Patent: Jul. 23, 2002

(54) METHOD FOR EVALUATING IMPURITY CONCENTRATIONS IN HEAT TREATMENT FURNACES

(75) Inventors: Sergei V. Koveshnikov; Douglas G. Anderson, both of Vancouver, WA (US)

(73) Assignee: SEH America, Inc., Vancouver, WA (US)

( * ) Notice: Subject to any disclaimer, the term of this patent is extended or adjusted under 35 U.S.C. 154(b) by 0 days.

(21) Appl. No.: 10/003,994

(22) Filed: Nov. 14, 2001

Related U.S. Application Data

(63) Continuation-in-part of application No. 09/544,197, filed on Apr. 6, 2000.

(51) Int. Cl.$^7$ .............................................. H01L 21/66
(52) U.S. Cl. ...................... 438/14; 438/476; 438/471; 438/928; 438/974
(58) Field of Search .................... 438/14, 143, 471, 438/476, 928, 974

(56) References Cited

U.S. PATENT DOCUMENTS 5,233,191 A    8/1993   Noguchi et al.
6,174,740 B1    1/2001   Ohta et al.

FOREIGN PATENT DOCUMENTS

| EP | 763735 A1 | * 3/1997 | .......... G01N/33/20 |
| JP | 05-286795 | * 11/1993 | .......... C30B/29/06 |
| JP | 08-340008 | * 12/1996 | .......... H01L/21/324 |
| JP | 10-223713 | * 8/1998 | .......... H01L/21/66 |

* cited by examiner

*Primary Examiner*—Stephen D. Meier
*Assistant Examiner*—Christy Novacek
(74) *Attorney, Agent, or Firm*—Douglas G. Anderson

(57) ABSTRACT

A method for evaluating the concentration of impurities in gases and equipment used in heat treatment of a semiconductor substrate is provided. The method includes processing a semiconductor substrate of known impurity levels in a heat treatment furnace, and measuring the impurity levels after the heat treatment processing by drawing together at least a portion of the impurities and measuring the concentration of impurities that were drawn together. In one embodiment of the invention, a gettering layer is formed adjacent one or more surfaces of the substrate to getter impurities from the substrate into the gettering layer. The impurity concentration of the gettering layer is then measured and the results are used to determine at least a range of impurity concentrations that were transferred to the substrate from the heat treatment process.

9 Claims, 3 Drawing Sheets

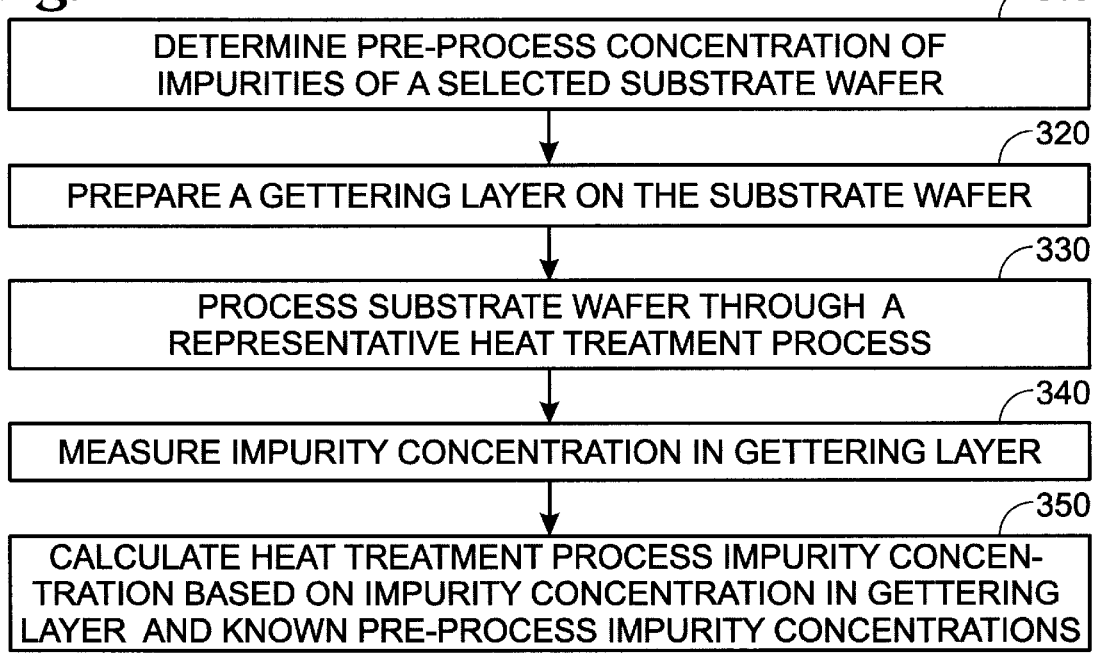
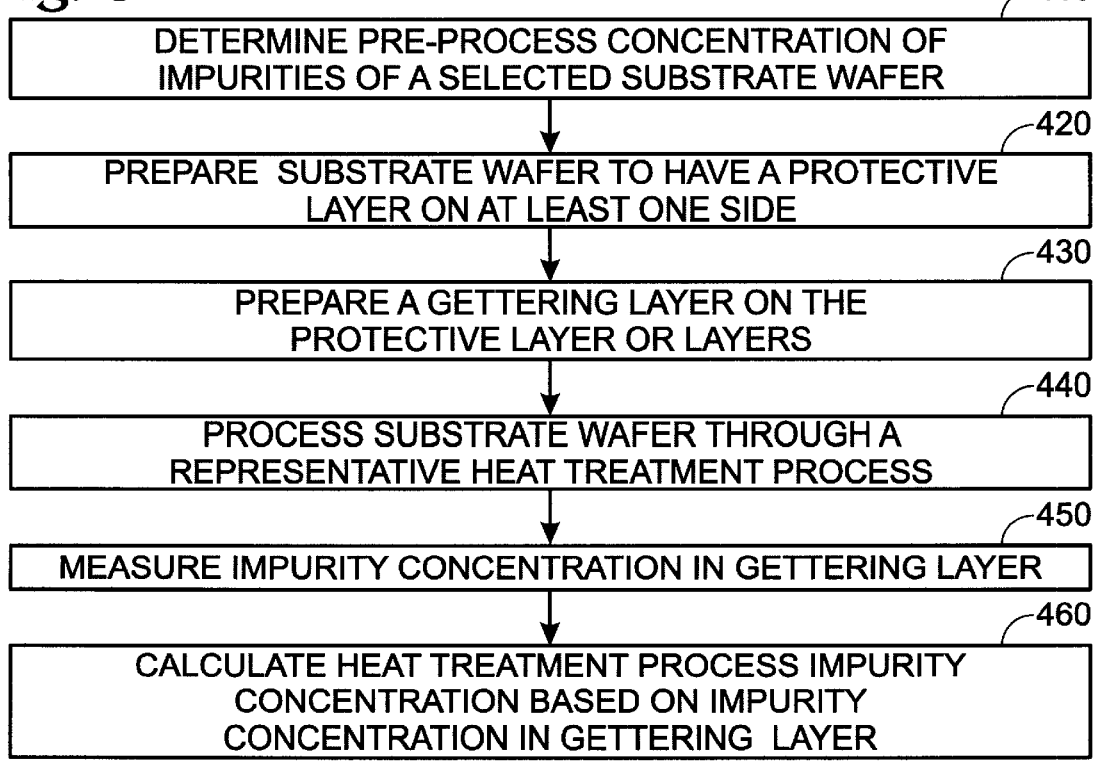

METHOD FOR EVALUATING IMPURITY CONCENTRATIONS IN HEAT TREATMENT FURNACES

REFERENCE TO RELATED APPLICATIONS

The present application is a continuation-in-part of U.S. application Ser. No. 09/544,197 filed Apr. 6, 2000, the contents of which are hereby incorporated by reference in their entirety.

TECHNICAL FIELD

The present invention relates to semiconductor processing, and more particularly to measuring impurity concentrations introduced into silicon wafers from processing equipment such as conventional furnaces and rapid thermal processing (RTP) machines.

BACKGROUND OF THE INVENTION

Manufacturers of semiconductor integrated circuits are constantly striving to increase the performance and reduce the price of their products. One way to both increase the performance and reduce the price of an integrated circuit is to reduce the size of the integrated circuit. By reducing the size of a circuit, more circuits can be manufactured on a single semiconductor substrate, thereby reducing the unit cost of the circuit. In addition, reducing the size of a circuit typically increases its speed and reduces its power consumption.

One problem manufacturers encounter in attempting to reduce the size of their integrated circuits involves impurity contamination. For example, metallic contamination of a semiconductor substrate can cause excess leakage currents, poor voltage breakdown characteristics, and reduced minority carrier lifetimes. As the size of an integrated circuit decreases, the detrimental effect of impurities in the semiconductor is magnified. For extremely small circuits, even relatively low levels of contamination can be sufficient to render the circuit inoperative. Therefore, manufacturers take extraordinary measures to prevent impurity contamination in their manufacturing processes.

To optimize their contamination control practices, manufacturers often need to measure the concentration of impurities in their semiconductor substrates at various points during the manufacturing process. This allows manufacturers to determine which area(s) of their process are causing impurity contamination problems. However, as the levels of impurity concentration have decreased to very low levels, it has become more and more difficult to measure the impurity concentration. Indeed, semiconductor industry standards such as the National Semiconductor Roadmap call for impurity concentrations to be as low as $10^{10}$ cm$^{-3}$ in the near future. Since the atomic density of a typical semiconductor substrate such as silicon is approximately $10^{22}$ cm$^{-3}$, impurity concentrations of $10^{10}$ cm$^{-3}$ can be very difficult to measure even with sophisticated measurement equipment.

For example, copper (Cu) and nickel (Ni) are two metallic impurities found in semiconductor substrates. Impurity concentrations of copper and nickel in heavily boron-doped substrates typically are measured by techniques such as Total Reflection X-Ray Fluorescence (TXRF) and Secondary Ion Mass Spectroscopy (SIMS), etc. The minimum detection limit of copper is approximately $10^{17}$ cm$^{-3}$ by TXRF (measured near the surface of the substrate) and approximately $10^{15}$ cm$^{-3}$ by SIMS. As a result, manufacturers have begun to search for new ways to measure impurity concentrations in semiconductor substrates.

As acceptable levels of metallic impurities are continually being reduced and new methods for measuring impurity concentrations are developed, manufacturers must understand and control the impurity concentrations of processes used to manufacture semiconductor substrates.

One such area of concern is the furnace used for heat treatment of the substrates. During heat treatment, one or more semiconductor substrates are placed on a holder made of quartz, and placed within a chamber, also typically made of quartz or graphite. The heat treatment chamber is sealed with a pressure seal that allows for pressure reduction during the process, as desired. The temperature is then elevated to the desired temperature, and maintained for a desired length of time. The elevated temperature and time are dependent upon many factors, depending on the goal of the treatment process. During the entire heat treatment cycle, a gas such as argon, oxygen, hydrogen, or nitrogen is passed over the semiconductor substrates. If any contaminants are present in any of the quartz or graphite parts, pressure seals, or the process gas, these contaminants can easily migrate into the semiconductor substrate, especially at elevated temperatures. It is therefore very important to use appropriate equipment components and gases that have low concentrations of impurities. Unfortunately, no reliable method currently exists to determine the concentration of metallic impurities is the various components and process gases used in performing heat treatment. There is a need, therefore, for a reliable method of determining and monitoring the contamination levels of equipment used for heat treatment to support and assist in circuit size reduction.

SUMMARY OF THE INVENTION

The invention provides a method for evaluating the concentration of impurities within a heat treatment process by measuring the concentrations of impurities of a semiconductor wafer on which a heat treatment process has been performed. The method includes running a representative heat treatment cycle with a monitor wafer having contamination levels below detection limits or at a low and known level placed in a heat treatment furnace. At least a portion of the contaminants that have been transferred to the semiconductor wafer from the heat treatment process wafer are drawn together and measured.

In one embodiment of the invention, a gettering layer is formed on one surface of the semiconductor wafer to getter impurities that have been transferred from the heat treatment process. The impurity concentration of the gettering layer is then measured and the results are used to determine at least a range of impurity concentrations contained within the heat treatment equipment and process gases.

In another embodiment, an oxide layer is formed on at least one surface of the semiconductor wafer, such as silicon dioxide ($SiO_2$). A gettering layer is then formed on the surface of the oxide layer, followed by the heat treatment process to be analyzed. The impurity concentration of the gettering layer is then measured and the results are used to determine at least a range of impurity concentrations contained within the heat treatment equipment and process gases. The oxide layer is used as a diffusion barrier for nickel (Ni) and iron (Fe) contaminants, effectively preventing any contaminants found within the substrate wafer from being gettered into the gettering layer. This, in turn, limits the source of nickel and iron impurities to the heat treatment equipment and process itself.

In yet another embodiment, an oxynitride layer ($SiO_xN_y$) is formed on at least one surface of the wafer. A gettering layer is then formed on the surface of the oxynitride layer, followed by the heat treatment process to be analyzed. The impurity concentration of the gettering layer is then measured and the results are used to determine at least a range of impurity concentrations contained within the heat treatment equipment and process gases. The oxynitride layer is used as a diffusion barrier for copper (Cu), nickel (Ni), and iron (Fe) contaminants, effectively preventing any contaminants found within the substrate wafer from being gettered into the gettering layer. This, in turn, limits the source of copper, nickel, and iron impurities gettered within the gettering layer to the heat treatment equipment and process itself.

BRIEF DESCRIPTION OF THE DRAWINGS

FIG. 4 is a flowchart illustrating the method of evaluating the concentration of impurities in a heat treatment furnace according to FIG. 2.

FIG. 5 is a flowchart illustrating the method of evaluating the concentration of impurities in a heat treatment furnace according to FIG. 3.

DETAILED DESCRIPTION OF THE INVENTION

Figure 1:
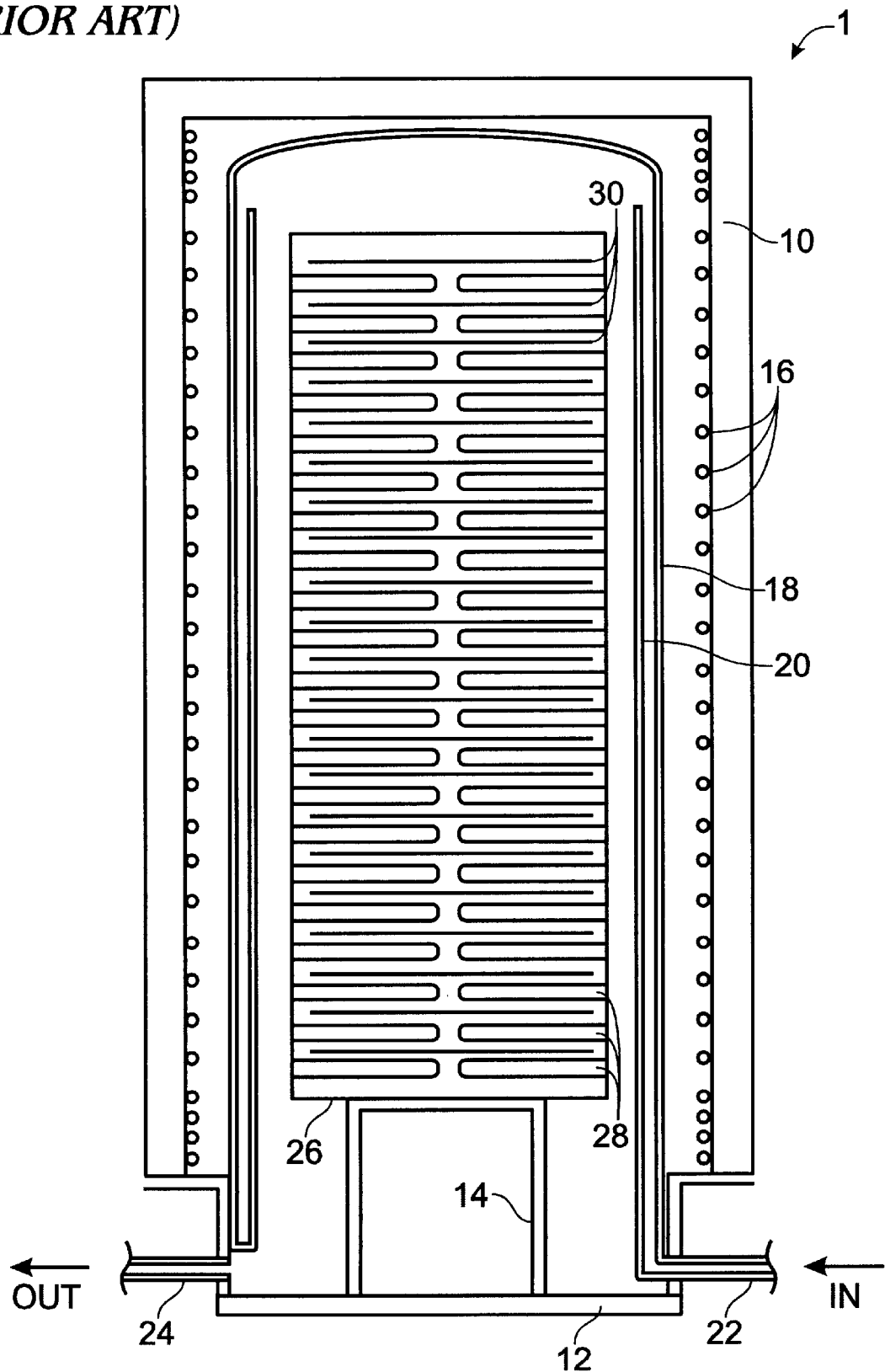
FIG. 1 is a cross-sectional view of a representative heat treatment chamber.

Referring now to FIG. 1, a heat treatment furnace is shown generally at 1. It should be noted that the heat treatment furnace shown is representative of a vertical heat treatment furnace and is used for illustrative purposes only, but the method of the invention is applicable to all types of heat treatment furnaces, such as vertical, horizontal, Rapid Thermal Processing (RTP), and so forth.

The heat treatment furnace 1 includes an insulated outer wall 10 and a moveable chamber floor 12, forming an enclosed chamber. Chamber floor 12 is moveable in that it can be lowered to allow for loading and unloading of the chamber, and raised to form a gas-tight seal. A sealing gasket (not shown) may be employed to ensure a gas-tight seal. Attached to chamber floor 12 is a pedestal 14, which supports and holds a wafer boat 26. The wafer boat 26 contains a plurality of wafer support teeth 28, in which wafers 30 are supported. A tube surrounds the wafer boat 26. In the case illustrated, the tube contains an outer wall 18 and an inner wall 20, but many other tube shapes are utilized in the industry. During the heat treatment process, a process gas is introduced into the chamber at inlet 22. The process gas is allowed to circulate around the wafer boat 26 and the wafers 30, and then exits through outlet 24. Heat is introduced into the chamber by heating elements 16. Typically, the wafer boat 26 and the tube are made out of quartz. Regardless of the materials used, all materials used in any heat treatment process have been selected for purity and heat compatibility. The important aspect of the present invention is not the materials used in the furnace, the type of process gas used, the configuration of the chamber, or the shape of any particular part. Rather, the invention focuses on determining if the chamber as a whole is contributing contaminants or metallic impurities to the substrate wafers during processing. Although all equipment and gases used are selected for their purity, occasionally a part a gas, or a seal will be contaminated or fail, without knowledge of the operator, Alternatively, the present invention can be utilized to qualify new parts at the beginning of a process, so as to ensure proper cleanliness.

For one embodiment, the present invention is performed using a wafer containing as little metallic impurities as possible, preferably below the detection limit of metals. If the wafer used is above the detection limit for metallic impurities, its level of metallic impurities must be known before being introduced to the heat treatment process and equipment, and will be used to compare before heat treatment and after heat treatment impurity levels.

As shown in FIG. 2a, a semiconductor substrate wafer 100 contains some impurities 102 contained within the body of the wafer 100. As mentioned above, it is important to either use a wafer 100 with a level of impurities 102 below the detection limit, or with a known level of impurities 102. In FIG. 2b, the wafer 100 is then subjected to the formation of a gettering layer 10 on at least one side of the substrate wafer 100, and optionally on both sides (not shown). The gettering layer optionally is very thin, in the order of 20 Å to 100 Å, thereby reducing costs and processing times, but is not required to be any particular thickness. In the case where gettering layer 110 is formed on both sides, it must be understood that the amount of impurities 102 ultimately gettered from the substrate wafer 100 into the gettering layers 110 will be divided such that approximately half of the impurities 102 will be gettered into each of the two gettering layers 110. Obviously, if only one gettering layer 110 is used, substantially all impurities 102 will be gettered into that one gettering layer 110. A typical manner for forming such a gettering layer is by low pressure chemical vapor deposition (LPCVD) of polycrystal line silicon. It is important to note that very little, if any, gettering of impurities 102 found within the substrate wafer 100 will be gettered into the gettering layer during the forming of the gettering layer 110.

The substrate wafer 100 containing gettering layer 110 is then subjected to a representative heat treatment cycle. For example, the wafer 100 may be annealed in the range of 600° C. to 900° C. for one hour, followed by a slow cool down to approximately 400° to 500° C. The slow cool down allows sufficient time for the impurities 102 to diffuse to the gettering layer 110. Upon completion of the heat treatment process, the impurities 102 originally located within the body of wafer 100 have migrated into the gettering layer 110.

The gettering layer 110 can then be analyzed by techniques such as Total Reflection X-Ray Flourescense (TXRF) and/or Secondary Ion Mass Spectroscopy (SIMS) using the techniques outlined in co-pending Application Number 09/544,197. Since the amount of impurities 102 is either known before the heat treatment process, or is below the detection limit, the amount of impurities found in the gettering layer 110 is easily calculated. Therefore, any amount of impurities 102 found in the gettering layer 110 above the calculated amount can be attributed to the heat treatment process itself. This knowledge can then be used to determine what, if any, action is required to address the heat treatment process.

Figure 2:
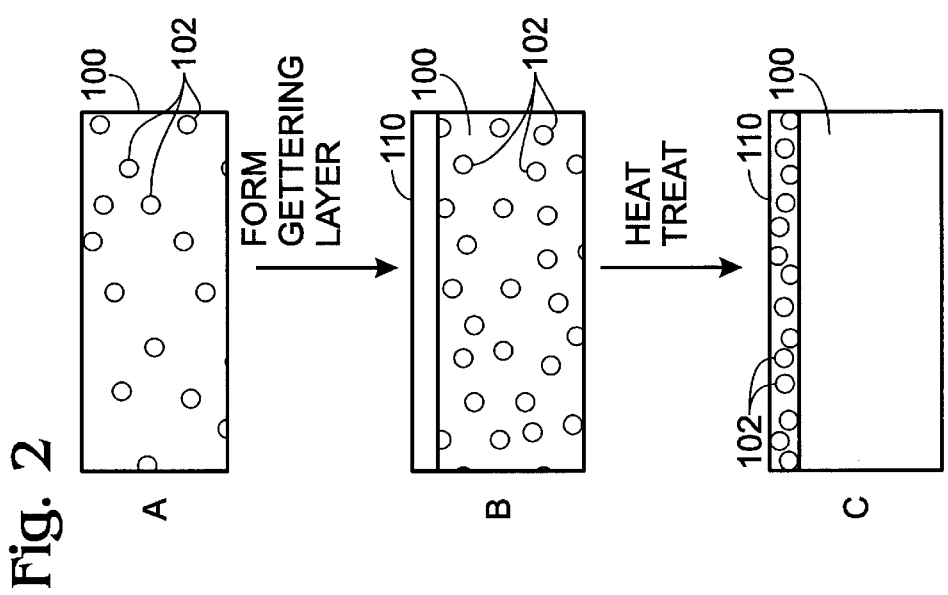
FIG. 2 is a schematic flowchart diagram of one embodiment, showing cross-sectional views of a semiconductor substrate that has been processed in a heat treatment furnace; the diagram illustrates a method according to the present invention for drawing together impurities transferred from the heat treatment furnace equipment and gases and from the semiconductor substrate to a gettering layer formed on the semiconductor substrate.

An exemplary method for evaluating the impurity concentrations in a heat treatment process corresponding to FIG. 2 is indicated generally in FIG. 4. The method includes, at 310, determining the "pre-process" bulk concentration of impurities in one or more semiconductor substrates. This may be performed by any suitable process, including the method described in co-pending application 09/544,197, TXRF, or SIMS, etc. Alternatively, this step may be omitted and the pre-process bulk impurity concentration may be presumed to be at a particular concentration. The one or more substrates are then processed through the semiconductor process, including a providing a gettering layer on at least one wafer surface, as indicated at 320.

A substrate wafer is then exposed to a heat treatment or annealing process using standard handling procedures and methods associated with the type of heat treatment equipment being monitored, also using standard processing steps for that particular heat treatment equipment, as shown in 330. Multiple substrate wafers can be singularly processed sequentially through steps 320 and 330 if desired, to obtain a statistically valid sampling in accordance with known statistical process control techniques.

The impurity concentration in the gettering layer is then measured by suitable means, as indicated at 340. Based on the impurity concentration in the gettering layer, the "post-process" bulk impurity concentration may be calculated using the known impurity concentrations from the substrate wafer and the concentration levels measured in 340, as indicated in 350. Appropriate decisions about the continued use of the equipment and process gases may then be made.

In another embodiment, the present invention is performed using a substrate wafer wherein the quantity of metallic impurities is not of concern. As shown in FIG. 3a, the substrate wafer 200 contains impurities 202. In this embodiment, however, the substrate wafer is then subjected to a process for depositing a barrier or protective layer 210 on at least one surface of the wafer, and optionally on both sides. The purpose of the barrier layer 210 is to prevent the impurities 202 found within the body of the wafer 200 from migrating to the gettering layer 220, as shown in FIG. 3c. Many barrier layers may be used to prevent migration of impurities, depending upon the types of impurities believed to be within the bulk wafer. For example, an oxide layer such as silicon dioxide ($SiO_2$) will act as an effective barrier for nickel (Ni) and copper (cu), but is not an effective barrier for iron (Fe). An oxynitride layer, such as a silicon oxynitride ($SiO_xN_y$) layer acts as an effective barrier for iron, copper, and nickel.

When the protective or barrier layer 210 is formed, there is very little or no gettering of the impurities 202 found within the wafer 200. Similarly, when gettering layer 220 is formed there is very little or no gettering of impurities 202.

Figure 3:
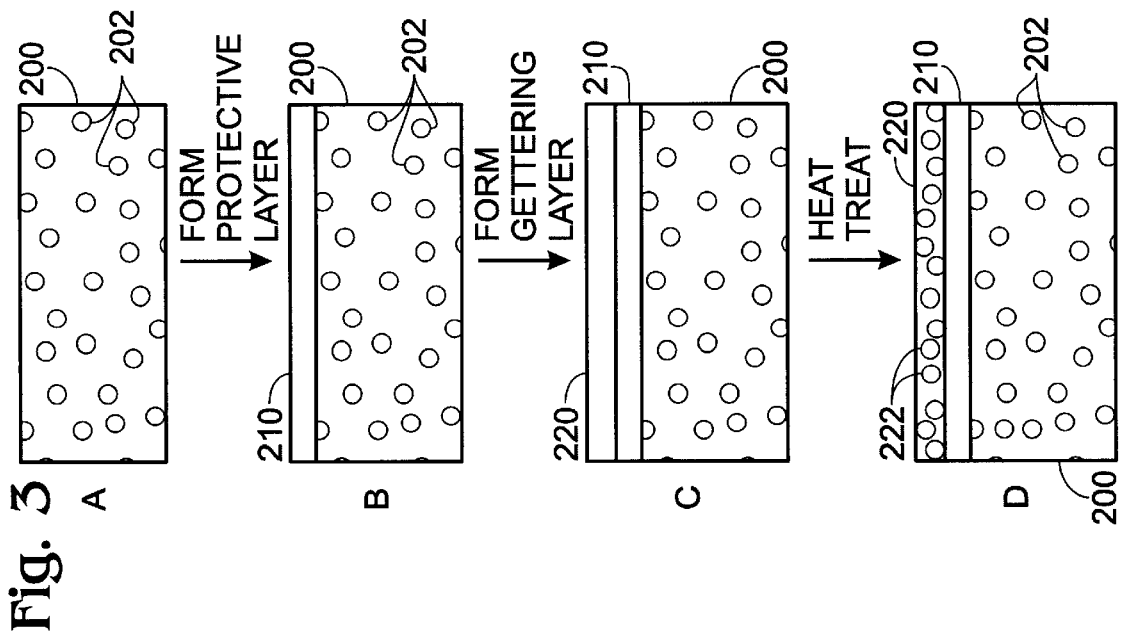
FIG. 3 is a schematic flowchart diagram of another embodiment, showing cross-sectional views of a semiconductor substrate that has been processed in a heat treatment furnace; the diagram illustrates a method according to the present invention for drawing together impurities transferred from the heat treatment furnace equipment and gases to a gettering layer formed on the semiconductor substrate.

Any gettering of impurities 202 is inconsequential, and in any event does not reach the gettering layer 220. The wafer 200 is then subjected to the heat treatment process in question, as shown in FIG. 3d. Because of the protective layer 210 deployed between gettering layer 220 and substrate wafer 200, no impurities 202 migrate into gettering layer 220. As such, essentially all impurities measured can be attributed to the heat treatment process. An exemplary method for evaluating the impurity concentrations in a heat treatment process corresponding to FIG. 3 is indicated generally in FIG. 5.

Other embodiments of the present invention will be apparent to those skilled in the art from a consideration of this specification or practice of the invention disclosed herein. It is intended that the specification be considered in all aspects as illustrative, and not restrictive. The scope of the invention is, therefore, indicated by the appended claims rather than by the forgoing description. All changes which come within the meaning and range of the equivalence of the claims are to be embraced within their scope.

What is claimed is:

1. A method of evaluating the concentration of impurities in a heat treatment process, the method comprising:

forming a protective layer on at least one surface of a substrate wafer to inhibit diffusion of impurities from the substrate wafer;

forming a gettering layer on the protective layer(s);

performing a heat treatment process; and measuring the concentration of impurities contained within the gettering layer, wherein at least a portion of impurities with equipment and gases used to perform the heat treatment process are gettered into the gettering layer.

2. The method of claim 1, wherein the protective layer is an oxide layer.

3. The method of claim 1, wherein the protective layer is an oxynitride layer.

4. The method of claim 1, wherein the gettering layer is a polysilicon layer.

5. The method of claim 1, further comprising determining the amount of impurities transferred to a substrate wafer during a heat treatment process from the amount of impurities gettered in the gettering layer.

6. The method of claim 1, wherein the impurities contain at least one of copper, nickel, or iron.

7. The method of claim 1, wherein substantially no impurities gettered in the gettering layer are from the substrate wafer.

8. The method of claim 1, wherein a Total Reflection X-Ray Flourescence (TXRF) analysis is used to measure the impurities contained within the gettering layer.

9. The method of claim 1, wherein a Secondary Ion Mass Spectroscopy (SIMS) analysis is used to measure the impurities contained within the gettering layer.

* * * * *